US006876042B1

(12) United States Patent
Yu et al.

(10) Patent No.: US 6,876,042 B1
(45) Date of Patent: Apr. 5, 2005

(54) ADDITIONAL GATE CONTROL FOR A DOUBLE-GATE MOSFET

(75) Inventors: Bin Yu, Cupertino, CA (US); Shibly S. Ahmed, San Jose, CA (US); Haihong Wang, Milpitas, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/653,105

(22) Filed: Sep. 3, 2003

(51) Int. Cl.$^7$ .......................... H01L 29/76; H01L 27/01
(52) U.S. Cl. ...................... 257/365; 257/347; 257/366
(58) Field of Search ....................... 257/67, 328, 329, 257/347, 353, 365, 366; 438/149, 152, 164, 212, 268, 277, 479, 517

(56) References Cited

U.S. PATENT DOCUMENTS

| 4,979,014 | A | 12/1990 | Hieda et al. ................ 357/56 |
| 6,359,311 | B1 | 3/2002 | Colinge et al. ............. 257/347 |
| 6,433,609 | B1 | 8/2002 | Voldman .................... 327/313 |
| 6,525,403 | B2 | 2/2003 | Inaba et al. ................ 257/618 |
| 6,657,252 | B2 * | 12/2003 | Fried et al. ................ 257/316 |
| 6,812,119 | B1 | 11/2004 | Ahmed et al. .............. 438/585 |
| 2002/0003255 | A1 | 1/2002 | Usuki et al. |
| 2002/0125536 | A1 | 9/2002 | Iwasa et al. ................ 257/368 |
| 2002/0153587 | A1 | 10/2002 | Adkisson et al. ........... 257/510 |
| 2002/0177263 | A1 | 11/2002 | Hanafi et al. .............. 438/183 |
| 2003/0042531 | A1 | 3/2003 | Lee et al. |
| 2003/0113970 | A1 | 6/2003 | Fried et al. |
| 2004/0075121 | A1 | 4/2004 | Yu et al. .................... 257/288 |

FOREIGN PATENT DOCUMENTS

EP      0 623 963 A1   11/1994

OTHER PUBLICATIONS

Jong–Tae Park et al.: "Multiple–Gate SOI MOSFETs: Device Design Guidelines," *IEEE Transactions on Electron Devices,* vol. 49, No. 12, Dec. 2002, pp. 2222–2229.

Fu–Liang Yang et al.: "25 nm CMOS Omega FETs," International Electron Devices Meeting 2002, IEDM, Technical Digest, Dec. 8–11, 2002 in New York, NY, pp. 255–258.

Toshikazu Mukaiyama et al.: "Fabrication of Gate–All–Around MOSFET By Silicon Anisotropic Etching Technique," *Solid State Electronics,* Elsevier Science Publishers, vol. 42, No. 7–8, Jul. 8, 1998, pp. 1623–1626.

Yang–Kyu Choi et al.: "Spacer FinFET: nanoscale double–gate CMOS technology for the terabit era, " *Solid State Electronics,* Elsevier Science Publishers, vol. 46, No. 10, Oct. 2002, pp. 1595–1601.

Effendi Leobandung et al.: "Wire–channel and wrap–around–gate metal–oxide–semiconductor field–effect transistors with a significant reduction of short channel effects," $41^{st}$ International Conference on Electron, Ion, and Photon Beams Technology and Nanofabrication in Dana point, CA, May 27–30, 1997, vol. 15, No. 6, *Journal of Vacuum Science &Technology B*(Microelectronics and Nonometer Structures), Nov.–Dec. 1997, AIP for American Vacuum Soc., pp. 2791–2794.

(Continued)

*Primary Examiner*—Hung Vu
(74) *Attorney, Agent, or Firm*—Harrity & Snyder LLP

(57) ABSTRACT

A FinFET includes a fin formed on an insulating layer and a first gate material layer formed proximate to sides of the fin. The FinFET further includes a protective layer formed above the first gate material layer and the fin, and a second gate material layer formed above the protective layer and the fin. The second gate material layer may be formed into a gate for the fin that may be biased independently of gate(s) formed from the first gate material layer, thus providing additional design flexibility in controlling the potential in the fin during on/off switching of the FinFET.

13 Claims, 11 Drawing Sheets

OTHER PUBLICATIONS

PCT International Search Report mailed Jul. 13, 2004, 5 pages.

PCT International Search Report, Apr. 8, 2004, 3 pages.

Digh Hisamoto et al.: "FinFet—A Self–Aligned Double–Gate MOSFET Scalable to 20 nm," IEEE Transactions on Electron Devices, vol. 47, No. 12, Dec. 2000, pp. 2320–2325.

Yang–Kyu Choi et al.: "Sub–20nm CMOS Fin Fet Technologies," 2001 IEEE, IEDM, pp. 421–424.

Xuejue Huang et al.: "Sub–50 nm P–Channel Fin FET," IEEE Transactions on Electron Devices, vol. 48, No. 5, May 2001, pp. 880–886.

Yang–Kyu Choi et al.: "Nanoscale CMOS Spacer FinFET for the Terabit Era," IEEE Electron Device Letters, vol. 23, No. 1, Jan. 2002, pp. 25–27.

Xuejue Huang et al.: "Sub 50–nm FinFET: PMOS," 1999 IEEE, IEDM, pp. 67–70.

Co–pending Appl. No. 10/348,758, filed Jan. 23, 2003, entitled "Germanium MOSFET Devices and Methods for Making Same," 22 page specification, 29 sheets of drawings.

Co–pending Appl. No. 10/274,961, filed Oct. 22, 2002, entitled "Double and Triple Gate MOSFET Devices and Methods for Making Same," 15 page specification, 12 sheets of drawings.

* cited by examiner

000

ADDITIONAL GATE CONTROL FOR A DOUBLE-GATE MOSFET

TECHNICAL FIELD

The present invention relates to semiconductor devices and methods of manufacturing semiconductor devices. The present invention has particular applicability to double-gate devices.

BACKGROUND ART

The escalating demands for high density and performance associated with ultra large scale integration semiconductor devices require design features, such as gate lengths, below 100 nanometers (nm), high reliability and increased manufacturing throughput. The reduction of design features below 100 nm challenges the limitations of conventional methodology.

For example, when the gate length of conventional planar metal oxide semiconductor field effect transistors (MOSFETs) is scaled below 100 nm, problems associated with short channel effects, such as excessive leakage between the source and drain, become increasingly difficult to overcome. In addition, mobility degradation and a number of process issues also make it difficult to scale conventional MOSFETs to include increasingly smaller device features. New device structures are therefore being explored to improve FET performance and allow further device scaling.

Double-gate MOSFETs represent new structures that have been considered as candidates for succeeding existing planar MOSFETs. In several respects, double-gate MOSFETs offer better characteristics than the conventional bulk silicon MOSFETs. These improvements arise because the double-gate MOSFET has a gate electrode on both sides of the channel, rather than only on one side as in conventional MOSFETs. When there are two gates, the electric field generated by the drain is better screened from the source end of the channel. Also, two gates can control roughly twice as much current as a single gate, resulting in a stronger switching signal.

A FinFET is a recent double-gate structure that exhibits good short channel behavior. A FinFET includes a channel formed in a vertical fin. The FinFET structure may be fabricated using layout and process techniques similar to those used for conventional planar MOSFETs.

SUMMARY OF THE INVENTION

Implementations consistent with the present invention provide a double-gate MOSFET that includes an additional gate control that provides increased design flexibility.

One aspect of the invention is directed to a method of manufacturing a semiconductor device. The method includes forming an insulating layer on a substrate, forming a fin structure on the insulating layer, the fin structure including a first side surface, a second side surface, and a top surface. The method further includes forming source and drain regions at ends of the fin structure and depositing a first gate material over the fin structure. The first gate material surrounding the top surface and the first and second side surfaces. Further, the method includes etching the first gate material to form a first gate electrode and a second gate electrode on opposite sides of the fin structure, planarizing the first gate material proximate to the fin structure, depositing a protective layer above the planarized first gate material and the fin structure, and depositing second gate material on the protective layer and above the fin structure.

Another aspect consistent with the invention is directed to a device that includes a substrate, an insulating layer formed on the substrate, a conductive fin formed on the insulating layer, and gate dielectric layers formed on side surfaces of the conductive fin. The device further includes a first gate material layer formed on the insulating layer and around the conductive fin and a protective layer formed over the conductive fin and the first gate material. A second gate material layer is formed over the protective layer and the conductive fin.

BRIEF DESCRIPTION OF THE DRAWINGS

Reference is made to the attached drawings, wherein elements having the same reference number designation may represent like elements throughout.

BEST MODE FOR CARRYING OUT THE INVENTION

The following detailed description of the invention refers to the accompanying drawings. The same reference numbers may be used in different drawings to identify the same or similar elements. Also, the following detailed description does not limit the invention. Instead, the scope of the invention is defined by the appended claims and equivalents.

A FinFET, as the term is used herein, refers to a type of MOSFET in which a conducting channel is formed in a vertical Si "fin." FinFETs are generally known in the art.

Figure 1:
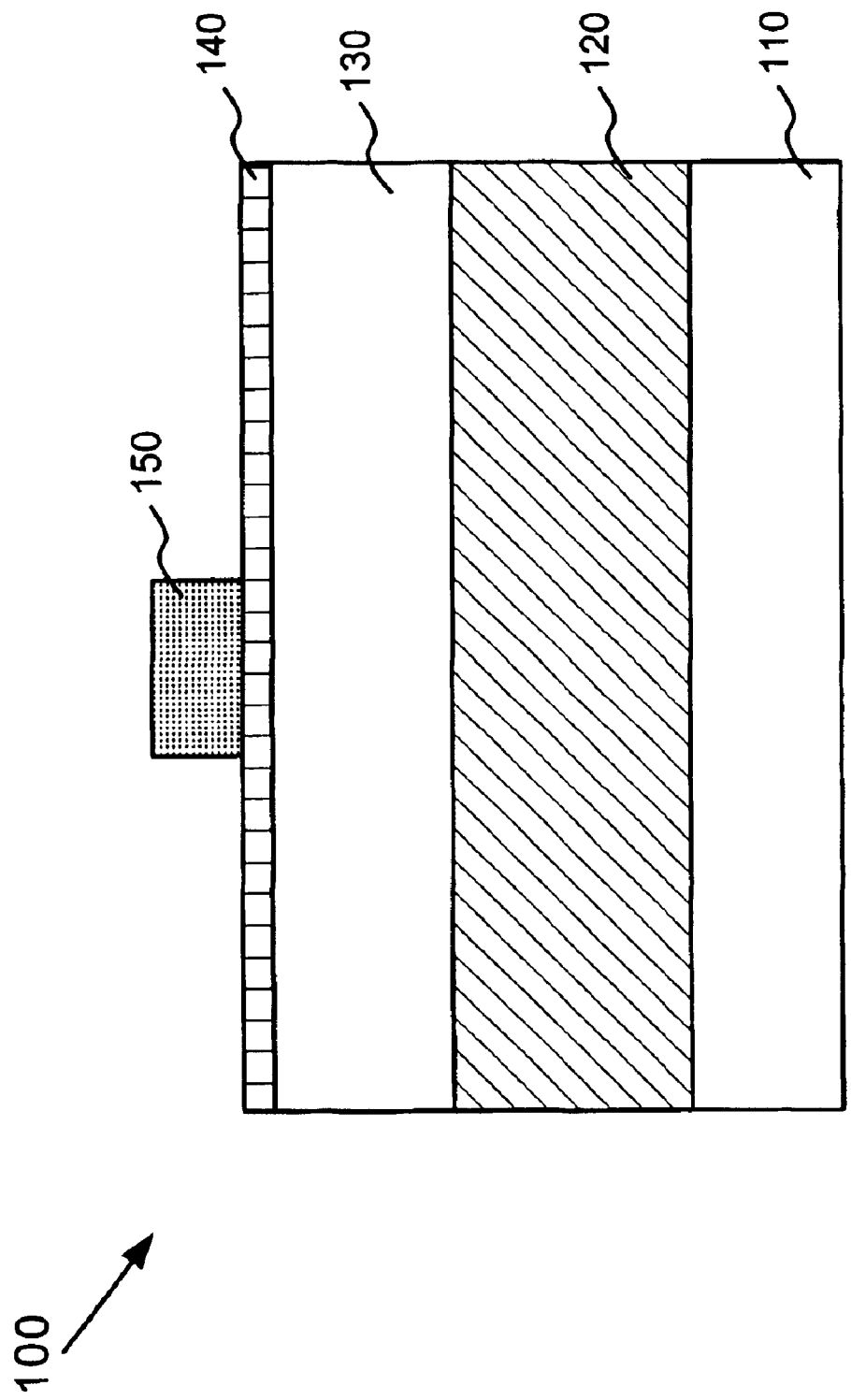
FIG. 1 is a diagram illustrating the cross-section of a semiconductor device.

FIG. 1 illustrates the cross-section of a semiconductor device 100 formed in accordance with an embodiment of the present invention. Referring to FIG. 1, semiconductor device 100 may include a silicon on insulator (SOI) structure that includes a silicon substrate 10, a buried oxide layer 120 and a silicon layer 130 formed on the buried oxide layer 120. Buried oxide layer 120 and silicon layer 130 may be formed on substrate 10 in a conventional manner.

In an exemplary implementation, buried oxide layer 120 may include a silicon oxide and may have a thickness ranging from about 1000 Å to about 3000 Å. Silicon layer 130 may include monocrystalline or polycrystalline silicon and may have a thickness ranging from about 300 Å to about 1000 Å. Silicon layer 130 is used to form a fin structure for a double-gate transistor device, as described in more detail below.

In alternative implementations consistent with the present invention, substrate 10 and layer 130 may include other semiconducting materials, such as germanium, or combinations of semiconducting materials, such as silicon-germanium. Buried oxide layer 120 may also include other dielectric materials.

A dielectric layer 140, such as a silicon nitride layer or a silicon oxide layer (e.g., $SiO_2$), may be formed over silicon layer 130 to act as a protective cap during subsequent etching processes. In an exemplary implementation, dielectric layer 140 may be grown to a thickness ranging from about 150 Å to about 700 Å. Next, a photoresist material may be deposited and patterned to form a photoresist mask 150 for subsequent processing. The photoresist may be deposited and patterned in any conventional manner.

Semiconductor device 100 may then be etched and the photoresist mask 150 may be removed. In an exemplary implementation, silicon layer 130 may be etched in a conventional manner, with the etching terminating on buried oxide layer 120 to form a fin. After the formation of the fin, source and drain regions may be formed adjacent the respective ends of the fin. For example, in an exemplary embodiment, a layer of silicon, germanium or combination of silicon and germanium may be deposited, patterned and etched in a conventional manner to form source and drain regions. In other implementations, silicon layer 130 may be patterned and etched to form source and drain regions simultaneously with the fin.

Figure 2A:
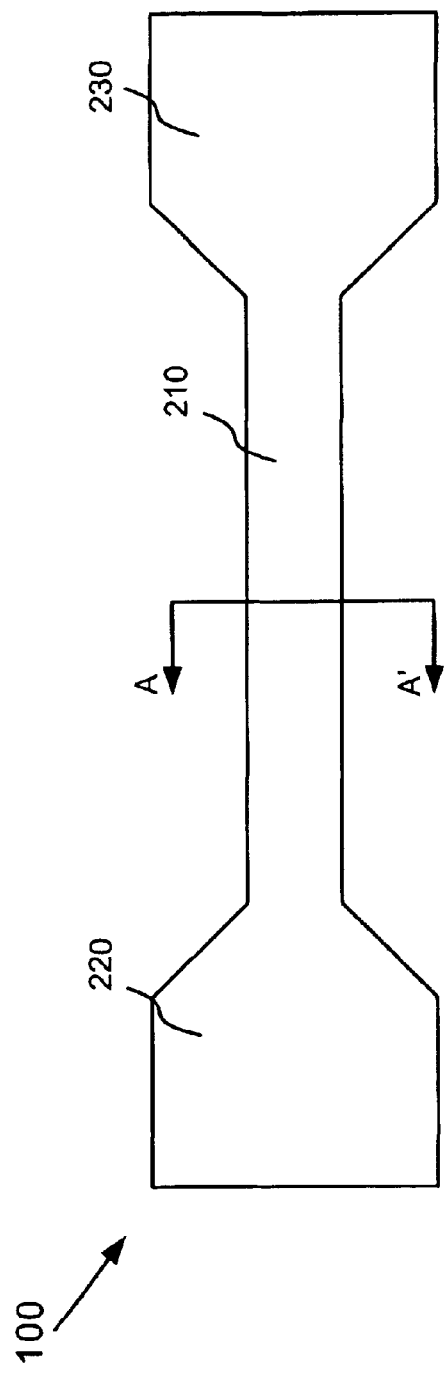
FIG. 2A is a diagram illustrating the top view of a fin structure formed on the semiconductor device shown in FIG. 1.

FIG. 2A schematically illustrates the top view of a fin structure 210 on semiconductor device 100 formed in such a manner. Source region 220 and drain region 230 may be formed adjacent the ends of fin structure 210 on buried oxide layer 120, according to an exemplary embodiment of the present invention.

Figure 2B:
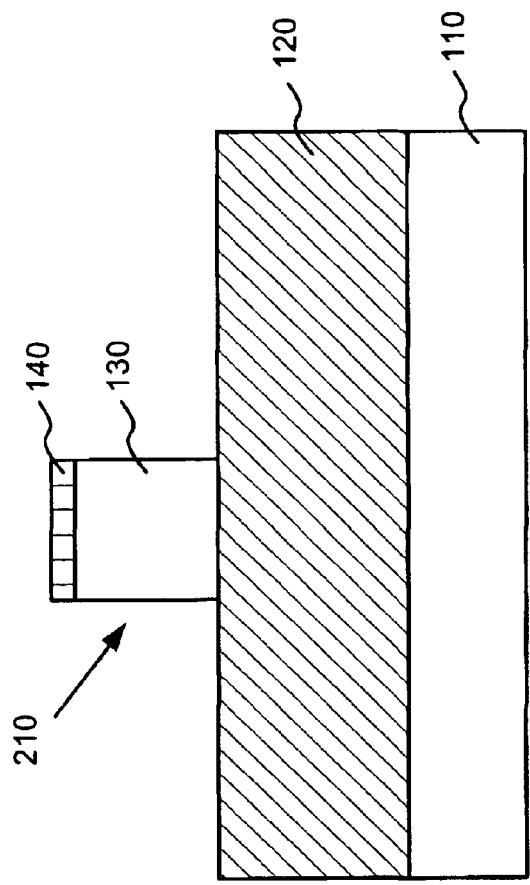
FIG. 2B is a diagram illustrating a cross-section along line A–A' in FIG. 2A.

FIG. 2B is a cross-section along line A–A' in FIG. 2A illustrating the formation of fin structure 210, which includes dielectric layer 140 and silicon layer 130 etched to the form shown in FIGS. 2A and 2B.

Figure 3:
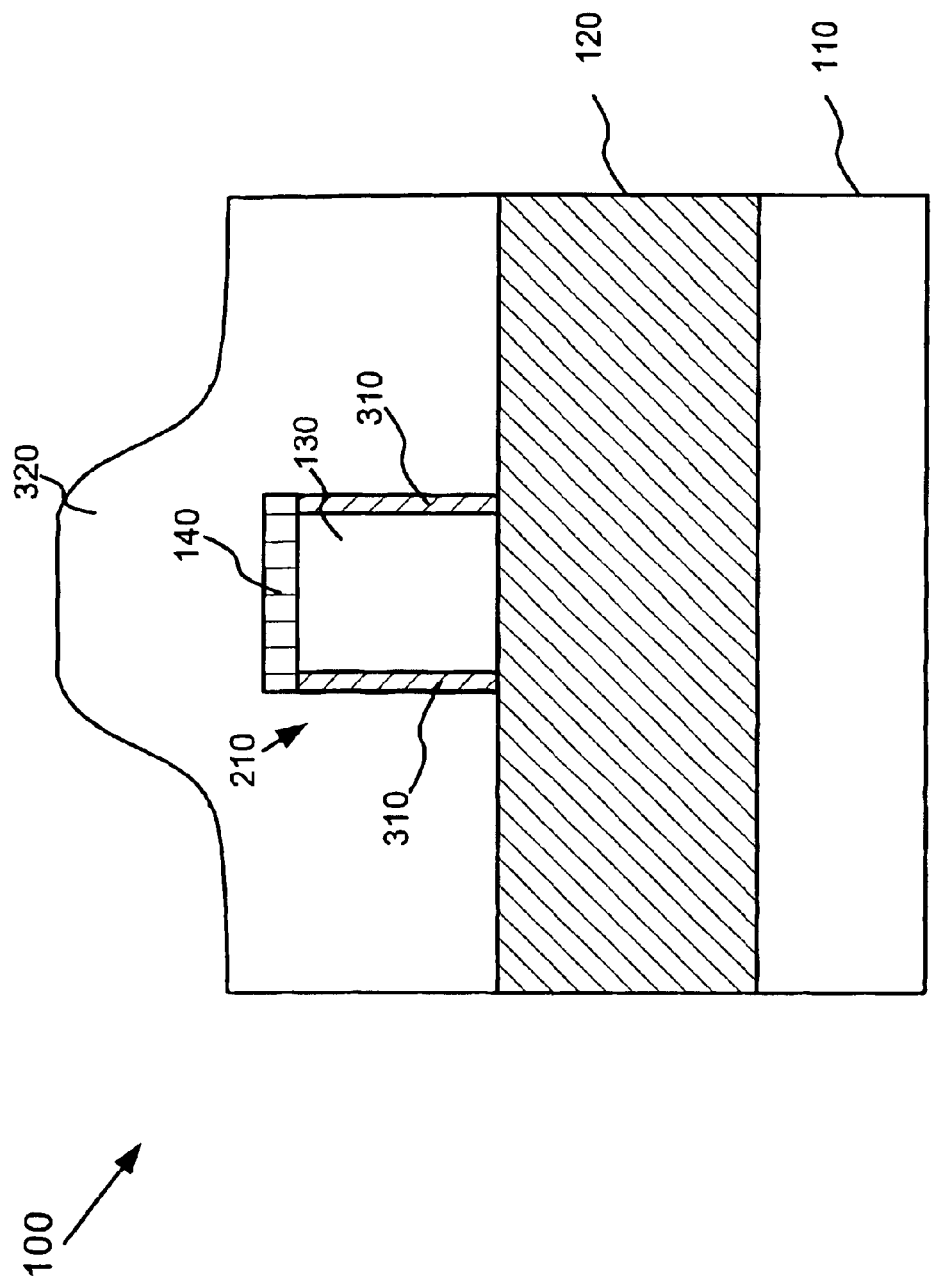
FIG. 3 is a diagram illustrating a cross-section of a gate dielectric layer and gate material formed over the fin structure shown in FIG. 2B.

FIG. 3 is a cross-section illustrating the formation of a gate dielectric layer and gate material over fin structure 210 in accordance with an exemplary embodiment of the present invention. A dielectric layer may be formed on silicon 130 of fin structure 210. For example, a thin oxide film 310 may be thermally grown on the fin portion of silicon layer 130, as illustrated in FIG. 3. The oxide film 310 may be grown to a thickness of about 10 Å to about 25 Å and may be formed on the exposed side surfaces of silicon layer 130. Alternatively, instead of a thin oxide film, a high-k gate dielectric such as $HfO_2$ may be deposited to a thickness of about 20 Å to about 40 Å.

A gate material layer 320 may be deposited over semiconductor device 100 after formation of the oxide film 310. In an exemplary implementation, gate material layer 320 may include polysilicon deposited using conventional chemical vapor deposition (CVD) or other well known techniques. Gate material 320 may be deposited to a thickness ranging from about 500 Å to 2800 Å. Alternatively, other semiconducting materials, such as germanium or combinations of silicon and germanium, or various metals may be used as the gate material. Gate material layer 320 forms a conductive gate for FinFET 100.

Figure 4:
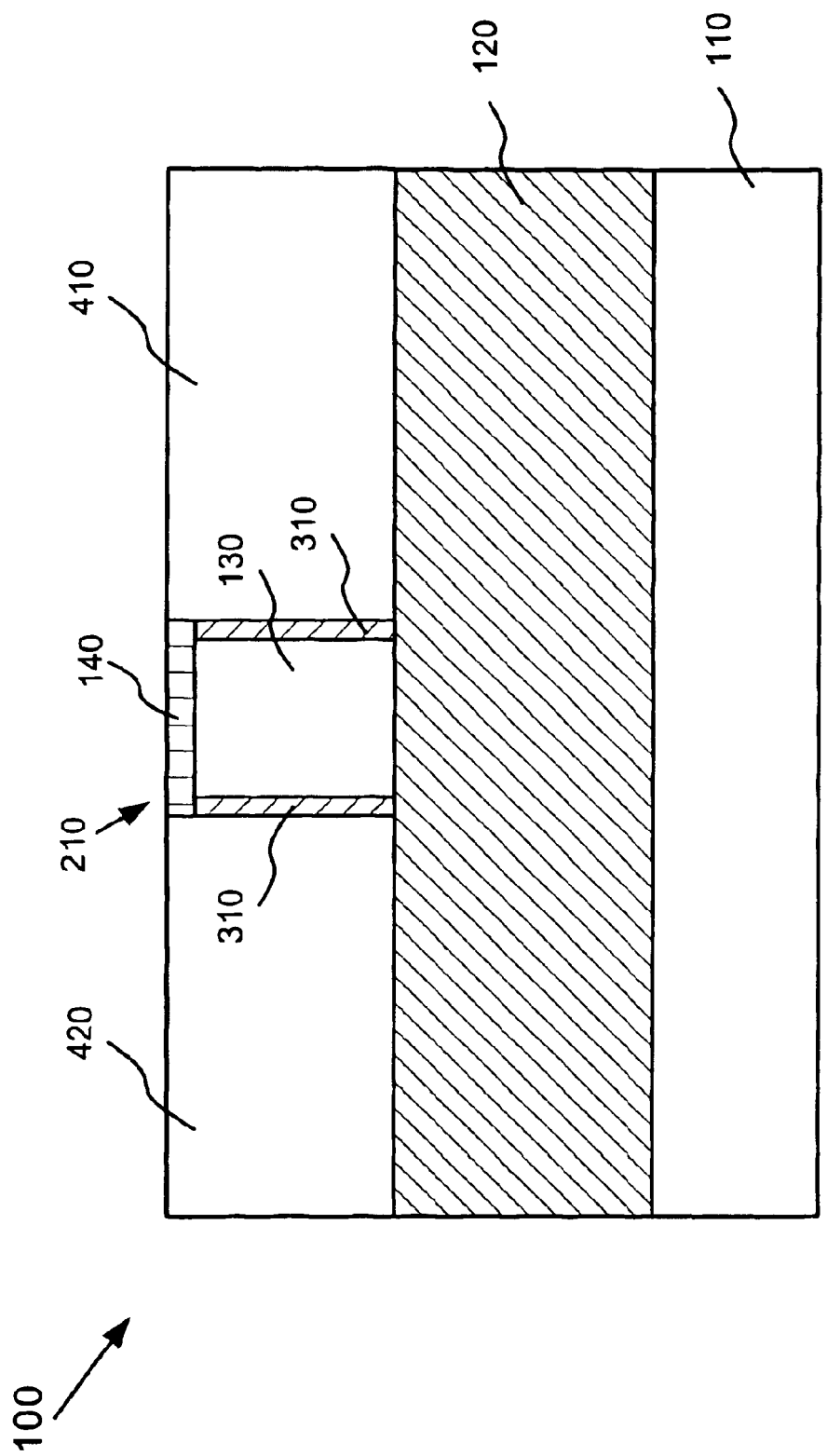
FIG. 4 is a cross-section illustrating planarizing of the gate material shown in FIG. 3.

FIG. 4 is a cross-section illustrating the planarizing of the gate material 320 in accordance with an exemplary embodiment of the present invention. Excess gate material may be removed (e.g., from above dielectric layer 140) to planarize the fin region of the semiconductor device 100. For example, chemical-mechanical polishing (CMP) may be performed so that the gate material (i.e., layer 320) is even with or nearly even with dielectric cap 140 in the vertical direction, as illustrated in FIG. 4.

Figure 5:
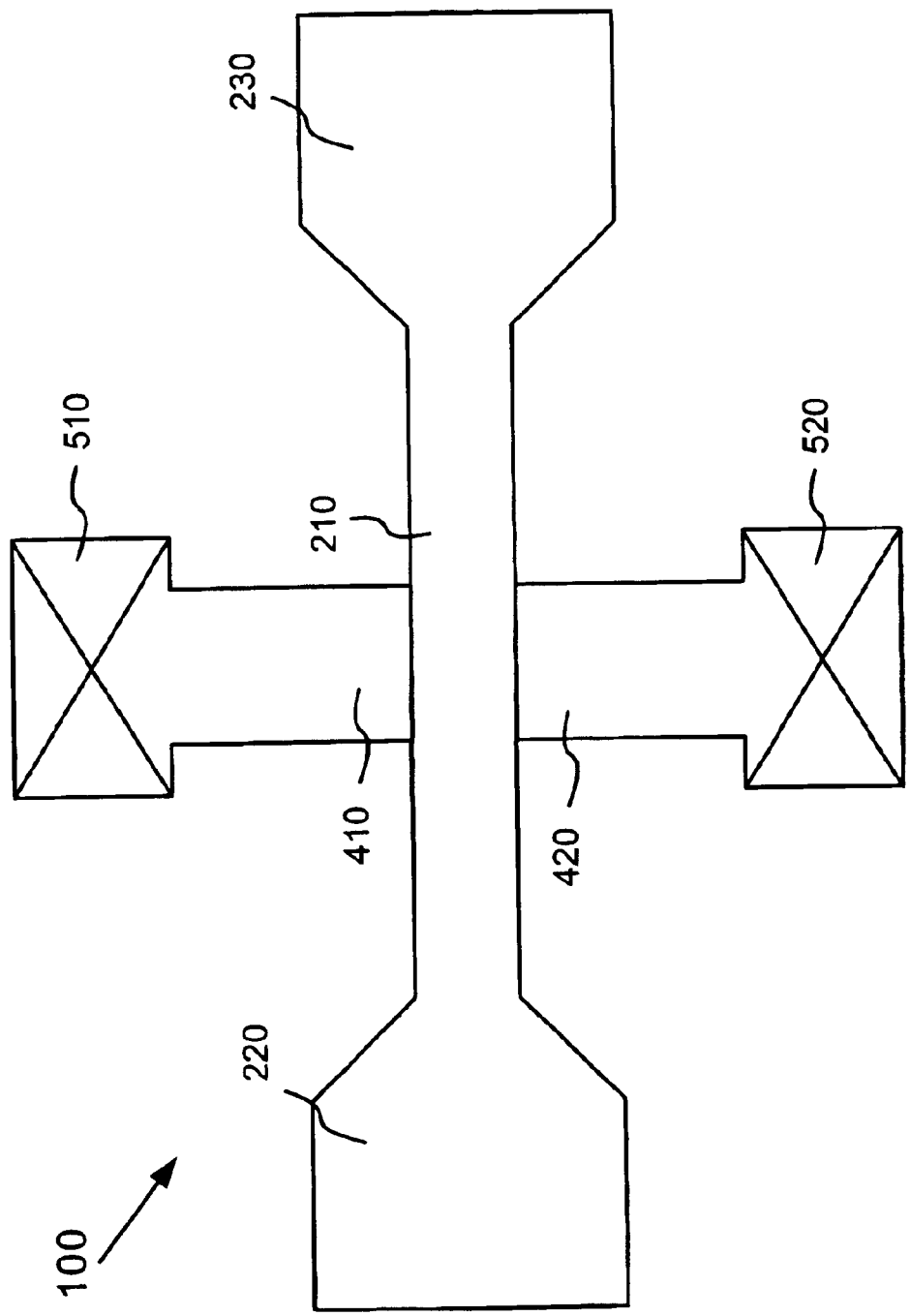
FIG. 5 is a diagram illustrating a top view of the device of FIG. 4.

Referring to FIG. 4, the gate material layer 320 in the channel region of semiconductor device 100 abuts fin structure 210 on the two side surfaces to form a first gate 410 and a second gate 420. This structure is also shown in FIG. 5, which illustrates a top view of semiconductor device 100 consistent with the present invention. In FIG. 5, first gate 410 and second gate 420 are shown adjacent, but not covering, fin structure 210.

End portions of first gate 410 and second gate 420 may be patterned and etched to form two gate electrodes. As illustrated in FIG. 5, semiconductor device 100 includes a double gate structure with gate electrodes 510 and 520. Gate electrodes 510 and 520 are effectively separated by fin structure 210 and may be separately biased. For simplicity, the gate dielectric 310 (FIG. 4) surrounding the side surfaces of fin 210 is not shown in FIG. 5.

Figure 6:
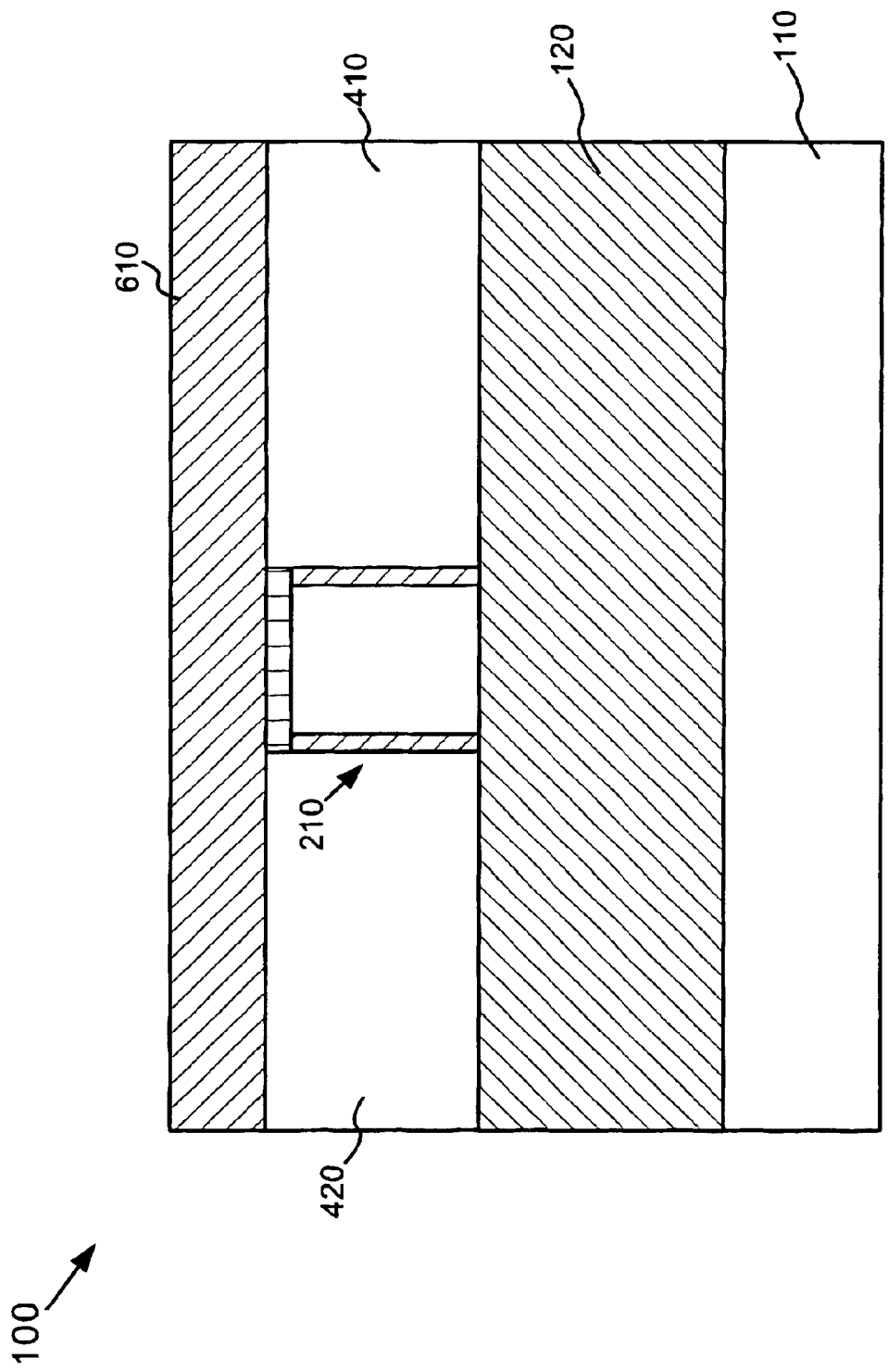
FIG. 6 is a cross-section illustrating a protective layer formed over the device shown in FIG. 4.

Referring to FIG. 6, a protective layer 610, such as an $SiO_2$ layer, may be formed over fin structure 210, first gate 410, and second gate 420. Protective layer 610 may be thermally grown to a thickness of about 150 Å to 300 Å.

Figure 7:
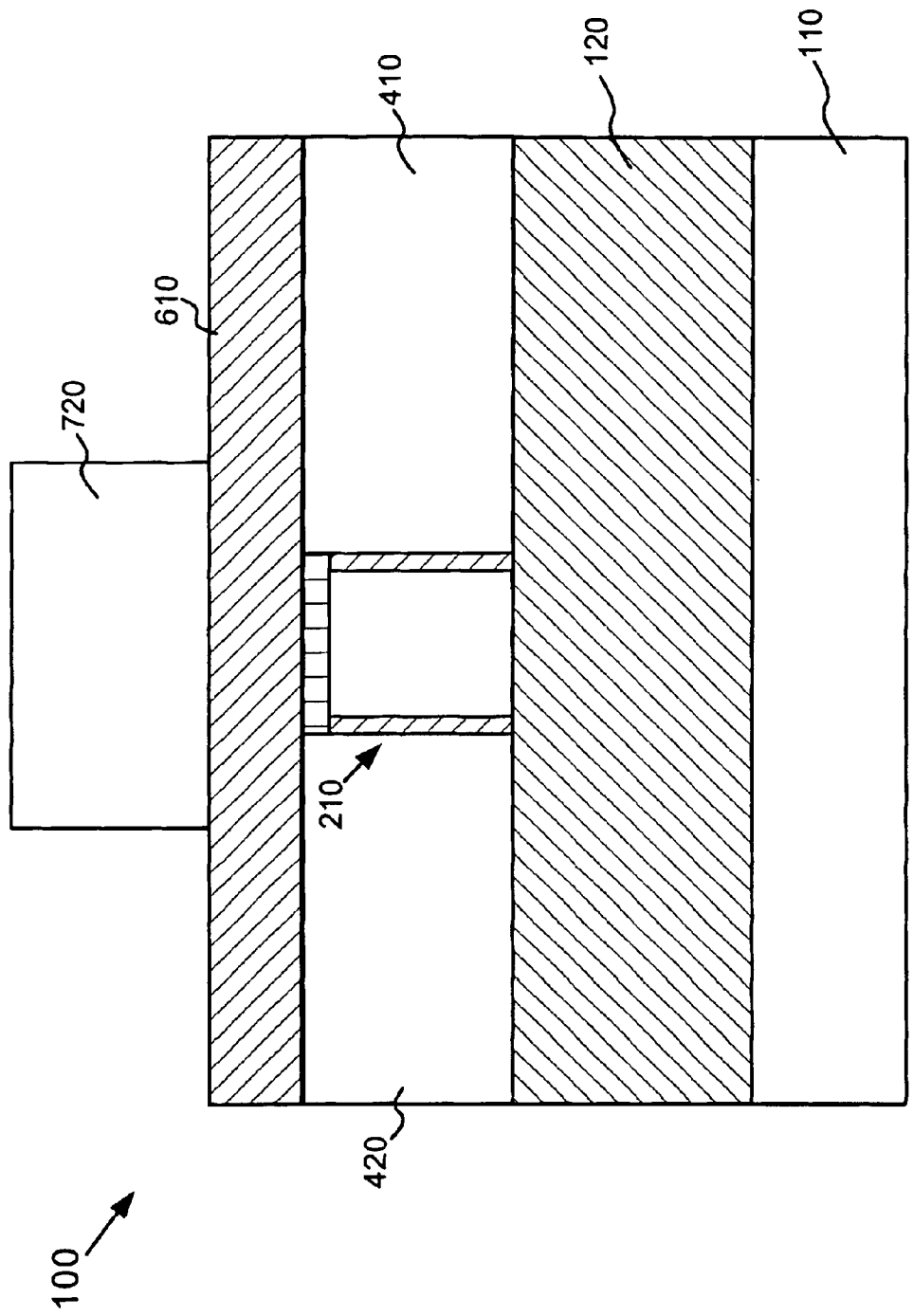
FIG. 7 is a cross-section illustrating a gate material layer formed over the protective layer shown in FIG. 6.

Another gate material layer 720, shown in FIG. 7, may be deposited over protective layer 610. Gate material layer 720 may be patterned and etched to cover fin structure 210, as shown in FIG. 7. Gate material layer 720 may include polysilicon deposited using conventional CVD or other well known techniques. Gate material 720 may be deposited to a thickness ranging from about 200 Å to about 1000 Å. Alternatively, instead of polysilicon, other semiconducting materials, such as germanium or combinations of silicon and germanium, or various metals, may be used for gate material layer 720. Gate material layer 720 may be used as a third gate electrode for semiconductor device 100.

Figure 8:
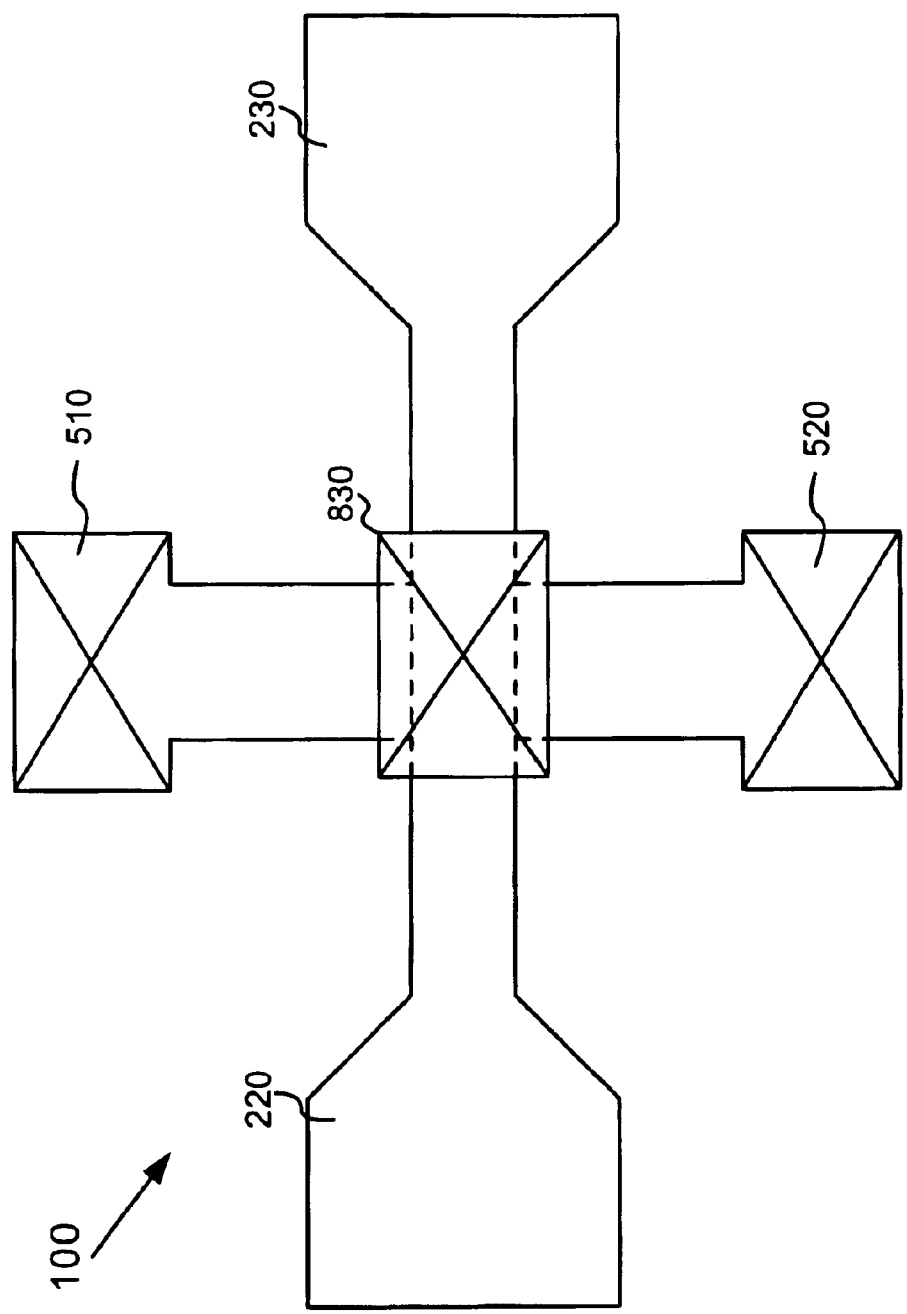
FIG. 8 is a top view illustrating a semiconductor device shown in FIG. 7.

FIG. 8 is a top view illustrating semiconductor device 100 after etching gate material layer 720 to form a gate electrode, illustrated as gate electrode 830. Thus, at this point, semiconductor device 100 includes three gate electrodes: electrode 510, electrode 520, and electrode 830 that may each be separately biased. Alternatively, instead of placing gate electrode 830 directly above fin structure 210, gate material layer 720 may lead to one side of fin structure 210 in a manner similar to gate material 320 of gate electrodes 510 and 520. In this implementation, gate electrode 830 may be placed near one of gate electrodes 510 or 520.

The source/drain regions 220 and 230 may be doped. For example, n-type or p-type impurities may be implanted in source/drain regions 220 and 230. The particular implantation dosages and energies may be selected based on the particular end device requirements. One of ordinary skill in this art would be able to optimize the source/drain implantation process based on the circuit requirements and such acts are not disclosed herein in order not to unduly obscure the thrust of the present invention. In addition, sidewall spacers (not shown) may optionally be formed prior to the source/drain ion implantation to control the location of the source/drain junctions based on the particular circuit requirements. Activation annealing may then be performed to activate the source/drain regions 220 and 230.

In semiconductor device 100, as described above, gate material layer 320 was planarized such that fin structure 210 separated gate material layer 320 into first and second separate gates 410 and 420, respectively. In alternate implementations, gate material layer 320 may be maintained as a single connected region. In this implementation, the final semiconductor device may only have two separately addressable gate electrodes.

Figure 9:
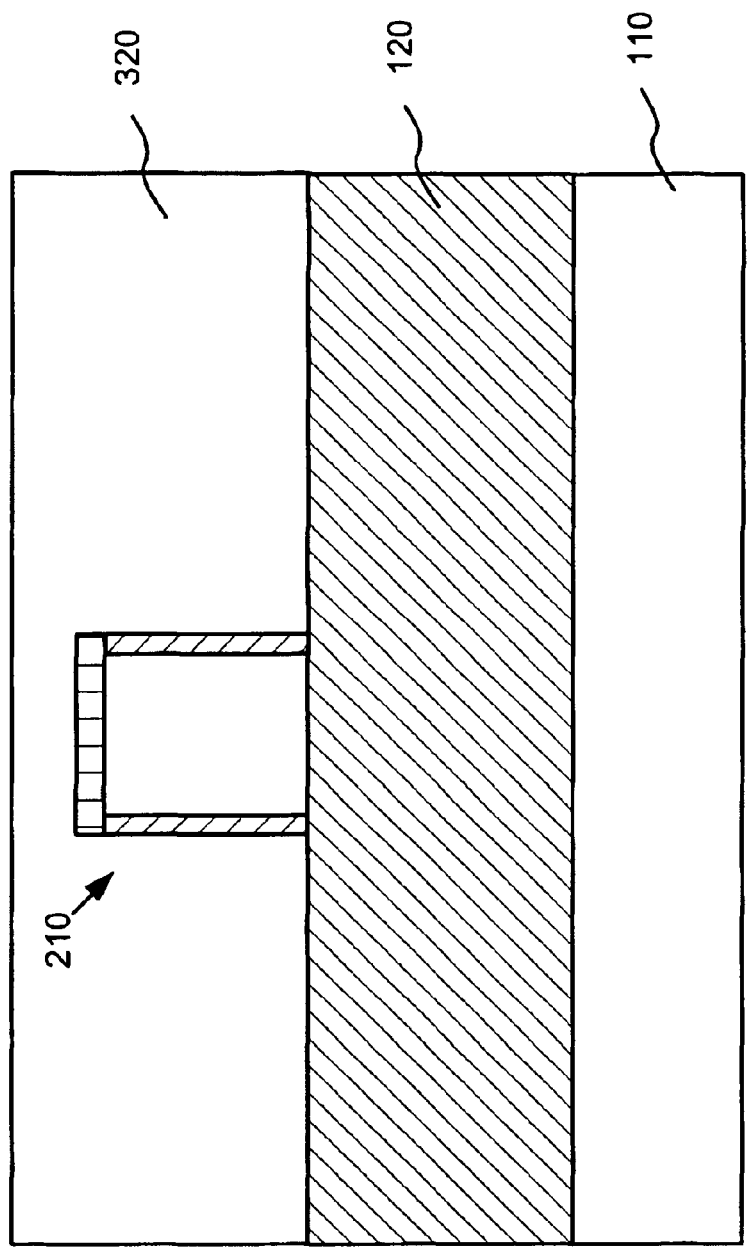
FIG. 9 is a cross-section illustrating planarizing of the gate material shown in FIG. 3 in an alternate implementation.
Figure 10:
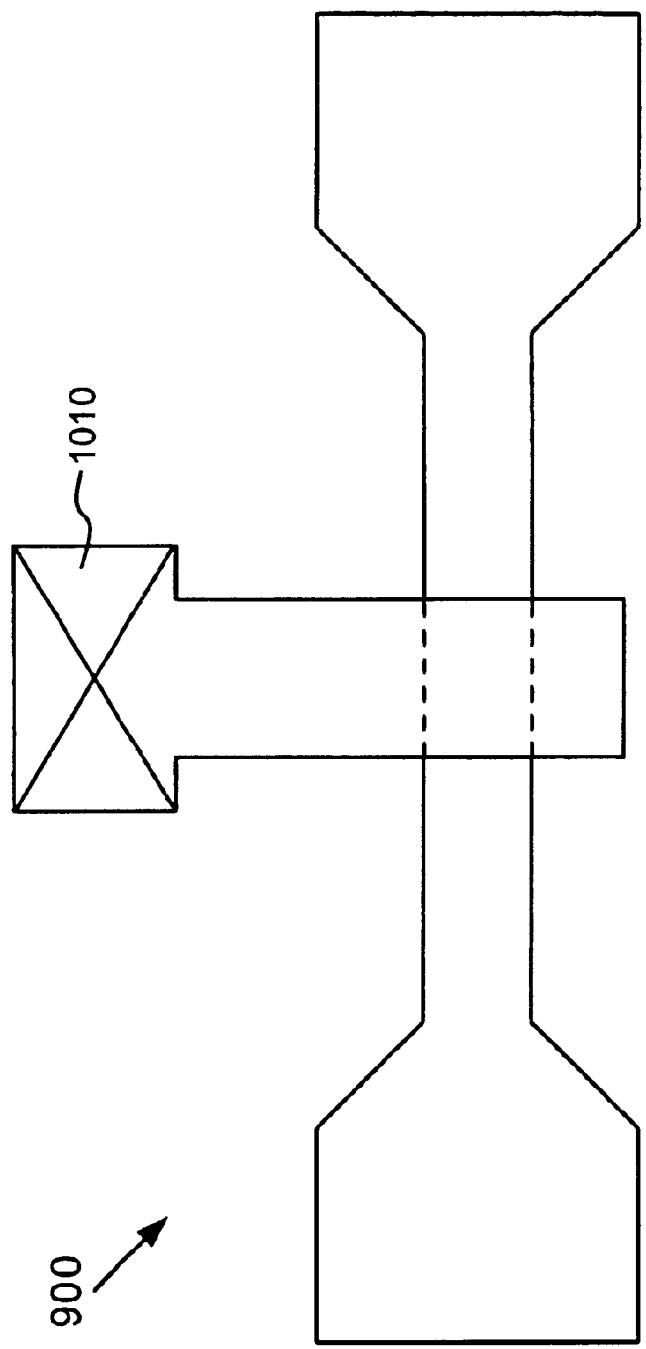
FIG. 10 is a diagram illustrating a top view of the device of FIG. 9.

FIG. 9 is a diagram illustrating a semiconductor device, labeled as semiconductor device 900, in which gate material layer 320 is maintained as a single connected region. Semiconductor device 900, as shown in FIG. 9, is similar to semiconductor device 100 as shown in FIG. 4, except in this implementation, the planarization process is stopped while gate material layer 320 is still over fin structure 210. Gate material layer 320 may then be patterned and etched to form a single gate electrode 1010 (FIG. 10). At this point, processing may proceed to add an additional gate electrode in the manner described about with reference to FIGS. 6–8.

Other Implementations

In order to act as an effective gate for semiconductor device 100, gate material layer 720 should be placed over fin structure 210. Accurately aligning gate material 720 over fin structure 210 to make an effective contact can, however, be difficult. To help alleviate this problem a T-shaped gate material layer may be used in place of gate material layer 720.

Figure 11:
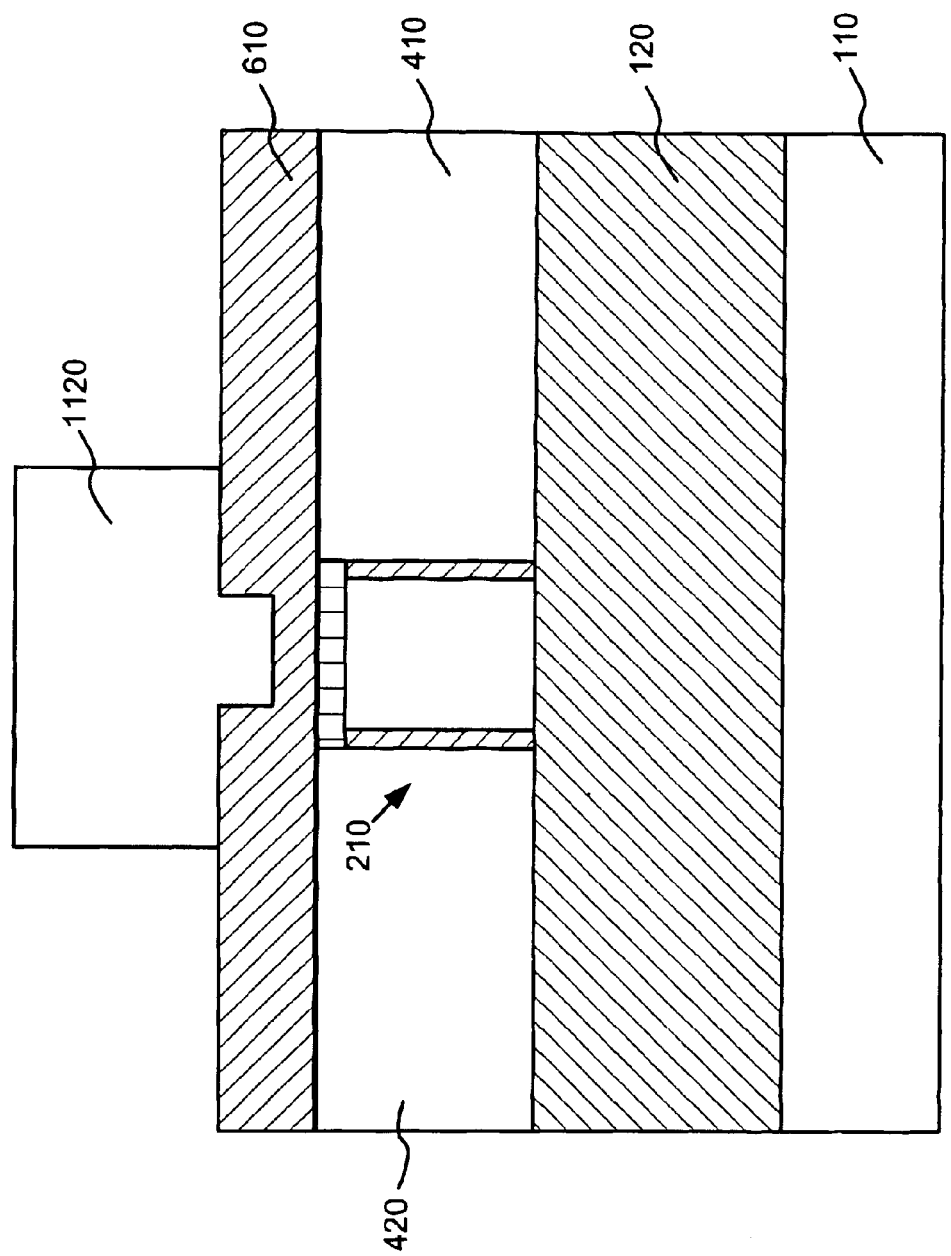
FIG. 11 is a cross-section illustrating the use of a T-shaped gate material layer.

FIG. 11 is a cross-sectional diagram similar to FIG. 7, but illustrating the use of T-shaped gate material layer 1120 in place of gate material 720. In particular, as shown in FIG. 11, protective layer 610 is formed over fin structure 210 to include an indentation in the area over fin structure 210. When gate material layer 1120 is deposited, it fills in the indentation, thus potentially forming an effective contact with protective layer 610.

CONCLUSION

A FinFET having three separately controllable gates is disclosed herein. The third gate may be biased independently of the other two gates and provides additional design flexibility in controlling the potential in the silicon fin during on/off switching.

In the previous descriptions, numerous specific details are set forth, such as specific materials, structures, chemicals, processes, etc., in order to provide a thorough understanding of the present invention. However, the present invention can be practiced without resorting to the specific details set forth herein. In other instances, well known processing structures have not been described in detail, in order not to unnecessarily obscure the thrust of the present invention.

The dielectric and conductive layers used in manufacturing a semiconductor device in accordance with the present invention can be deposited by conventional deposition techniques. For example, metallization techniques, such as various types of chemical vapor deposition (CVD) processes, including low pressure chemical vapor deposition (LPCVD) and enhanced chemical vapor deposition (ECVD) can be employed.

The present invention is applicable in the manufacturing of semiconductor devices and particularly in semiconductor devices with design features of 100 nm and below, resulting in increased transistor and circuit speeds and improved reliability. The present invention is applicable to the formation of any of various types of semiconductor devices, and hence, details have not been set forth in order to avoid obscuring the thrust of the present invention. In practicing the present invention, conventional photolithographic and etching techniques are employed and, hence, the details of such techniques have not been set forth herein in detail.

Only the preferred embodiments of the invention and a few examples of its versatility are shown and described in the present disclosure. It is to be understood that the invention is capable of use in various other combinations and environments and is capable of modifications within the scope of the inventive concept as expressed herein.

What is claimed is:

1. A semiconductor device, comprising:

a substrate;

an insulating layer formed on the substrate;

a fin formed on the insulating layer and including a plurality of side surfaces and a top surface;

a first gate formed on the insulating layer proximate to one of the plurality of side surfaces of the fin;

a second gate formed on the insulating layer separate from the first gate and proximate to another one of a plurality of side surfaces of the fin;

a protective layer formed above the fin, the first gate, and the second gate; and a third gate formed over the protective layer and over the fin, wherein the first, second, and third gates are independently addressable via respective gate electrodes.

2. The semiconductor device of claim 1, further including:

first and second dielectric layers formed along the plurality of side surfaces of the fin and in contact with the first and second gates, respectively.

3. The semiconductor device of claim 1, wherein the protective layer is formed to a thickness of about 150 Å to 300 Å.

4. The semiconductor device of claim 1, wherein the third gate is formed to a thickness of about 200 Å to 1000 Å.

5. The semiconductor device of claim 1, wherein the fin comprises at least one of silicon and germanium.

6. The semiconductor device of claim 1, wherein the insulating layer comprises a buried oxide layer.

7. The semiconductor device of claim 1, further comprising:

a source region and a drain region formed above the insulating layer and adjacent a respective first and second end of the fin.

8. A MOSFET device comprising:

a substrate;

an insulating layer formed on the substrate;

a conductive fin formed on the insulating layer;

gate dielectric layers formed on side surfaces of the conductive fin;

a first gate material layer formed on the insulating layer and around the conductive fin;

a first gate electrode connected to the first gate material layer and configured to allow the first gate material to be electrically biased;

a protective layer formed over the conductive fin and the first gate material;

a second gate material layer formed over the protective layer and the conductive fin; and a second gate electrode connected to the second gate material layer and configured to allow the second gate material to be electrically biased independently of the first gate material.

9. The MOSFET device of claim 8, wherein the MOSFET device is a FinFET.

10. The MOSFET device of claim 8, wherein the first and second gate material layers are formed of polysilicon.

11. The MOSFET device of claim 8, wherein the gate dielectric layers and the conductive fin break the first gate material layer into independently addressable first and second gates of the MOSFET device.

12. The MOSFET device of claim 11, wherein the second gate material forms a third independently addressable gate of the MOSFET device.

13. A semiconductor device, comprising:

a substrate;

an insulating layer formed on the substrate;

a fin formed on the insulating layer and including a plurality of side surfaces and a top surface;

a first control gate formed on the insulating layer proximate to one of the plurality of side surfaces of the fin;

a first gate electrode connected to the first control gate and configured to allow the first control gate to be electrically biased;

a second control gate formed on the insulating layer separate from the first control gate and proximate to another one of a plurality of side surfaces of the fin;

a second gate electrode connected to the second control gate and configured to allow the second control gate to be electrically biased separately from the first control gate;

a protective layer formed above the fin;

a third control gate formed over the protective layer and over the fin; and a third gate electrode connected to the third control gate and configured to allow the third control gate to be electrically biased separately from the first and second control gates.

* * * * *